(12) United States Patent
Hinterschuster et al.

(10) Patent No.: US 8,758,579 B2
(45) Date of Patent: Jun. 24, 2014

(54) CHAMBER FOR PHYSICAL VAPOUR DEPOSITION AND DOOR FOR A PHYSICAL VAPOUR DEPOSITION CHAMBER

(75) Inventors: Reiner Hinterschuster, Hammersbach (DE); Lothar Lippert, Kleinostheim (DE)

(73) Assignee: Applied Materials, Inc., Santa Clara, CA (US)

( * ) Notice: Subject to any disclaimer, the term of this patent is extended or adjusted under 35 U.S.C. 154(b) by 375 days.

(21) Appl. No.: 12/781,723

(22) Filed: May 17, 2010

(65) Prior Publication Data
US 2011/0278166 A1 Nov. 17, 2011

(30) Foreign Application Priority Data

May 11, 2010 (EP) .................................... 10162560

(51) Int. Cl.
*C23C 14/50* (2006.01)
(52) U.S. Cl.
USPC ............ 204/298.15; 204/298.01; 204/298.06; 204/298.23; 204/298.28; 204/192.12; 427/62
(58) Field of Classification Search
USPC ............. 204/298.01, 298.06, 298.23, 192.02, 204/298.28
See application file for complete search history.

(56) References Cited

U.S. PATENT DOCUMENTS

| 4,519,885 | A * | 5/1985 | Innis .......................... 204/192.12 |
| 5,824,197 | A | 10/1998 | Tanaka |
| 6,254,745 | B1 * | 7/2001 | Vukovic .................. 204/298.06 |
| 7,501,145 | B2 * | 3/2009 | Selvamanickam et al. ..... 427/62 |
| 2004/0251130 | A1 * | 12/2004 | Liu et al. .................. 204/298.01 |
| 2007/0134500 | A1 | 6/2007 | Hartig |
| 2010/0101949 | A1 * | 4/2010 | Trassl et al. .............. 204/298.28 |

FOREIGN PATENT DOCUMENTS

WO WO-0049196 A1 8/2000

OTHER PUBLICATIONS

Extended European Search Report dated Aug. 2, 2010 for European Patent Application No. 10162560.6.
International Search Report and Written Opinion dated Jun. 21, 2011 for International Application No. PCT/EP2011/057626.
European Office Action dated Jun. 28, 2012 for European Patent Application No. 10162560.6.
Communication pursuant to Article 94(3) EPC for Application No. 10 162 560.6-2222 dated Nov. 14, 2012.
Communication pursuant to Article 94(3) EPC for Application No. 10 162 560.6-1564 dated Apr. 8, 2013.
Rotating Cylindrical Magnetron Sputtering: Simulation of the Reactive Process, D. Depla et al., Journal of Applied Sciences 107, Jun. 7, 2010.

* cited by examiner

*Primary Examiner* — Keith Hendricks
*Assistant Examiner* — Timon Wanga
(74) *Attorney, Agent, or Firm* — Patterson & Sheridan, LLP

(57) ABSTRACT

A chamber for physical vapor deposition is provided. The chamber includes a housing, a door for opening and closing the housing, and a bearing for receiving a target, wherein the bearing is oriented in a first direction. Further, the chamber is adapted so that the target is at least partially removable from the chamber in the first direction. According to an embodiment, a chamber for physical vapor deposition is provided. The chamber is adapted for receiving at least one target and a substrate. The chamber includes a housing, a door, and at least one bearing for mounting the target, wherein the bearing is attached to the door.

19 Claims, 14 Drawing Sheets

CHAMBER FOR PHYSICAL VAPOUR DEPOSITION AND DOOR FOR A PHYSICAL VAPOUR DEPOSITION CHAMBER

TECHNICAL FIELD OF THE INVENTION

Embodiments of the present invention relate to a chamber for physical vapor deposition. Particularly, they relate to a chamber including a door and a housing. Specifically, they relate to a sputter deposition chamber. Further, embodiments relate to a method of maintenance of a chamber for physical vapor deposition. Embodiments of the present invention relate to nano-manufacturing technology solutions involving equipment, processes, and materials used in the deposition of thin films and coatings, with representative examples including (but not limited to) applications involving: semiconductor and dielectric materials and devices, silicon-based wafers, flat panel displays (such as TFTs), masks and filters, energy conversion and storage (such as photovoltaic cells, fuel cells, and batteries), solid-state lighting (such as LEDs and OLEDs), magnetic and optical storage, micro-electromechanical systems (MEMS) and nano-electro-mechanical systems (NEMS), micro-optic and optoelectronic devices, architectural and automotive glasses, metallization systems for metal and polymer foils and packaging, and micro- and nano-molding.

BACKGROUND OF THE INVENTION

Physical vapor deposition is often utilized for a variety of applications. For instance, different data media, such as CD and DVDs are coated in a physical vapor deposition process. But also foils, tools and microelectronic devices are produced by this method. Chambers for physical vapor deposition optionally include a substrate, on which a material is to be deposited and a target, from which the material stems.

Almost all metals can be used as material to be deposited. A process gas is introduced in a physical vapor deposition chamber. Often, the target is used as a cathode and the substrate is used as an anode. By applying a voltage between anode and cathode, the gas there between becomes plasma. The particles in the plasma of the process gas can react with the target and release particles from the target material. The particles of the target material are deposited on the surface of the substrate.

When the deposition material of the target is exhausted, the target has to be removed from the chamber and has to be replaced by a new target. Also, the chamber has to be cleaned from time to time, thereby removing the target material, which was not deposited on the substrate but on parts of the chamber (for instance chamber walls, target periphery etc.) due to spreading of the target material particles.

The step of removing the target and mounting it again after the periphery of the target or the target itself has been replaced, occupies a certain amount of the time needed for maintenance of the chamber. Thus, long-life targets and process conditions limiting the spreading of material to a certain amount are common means for preventing too much loss of production time.

SUMMARY OF THE INVENTION

According to an embodiment, a chamber for physical vapour deposition is provided. The chamber includes a housing; a door for opening and closing the chamber; and a bearing for receiving a target, wherein the bearing is oriented in a first direction and the chamber is adapted so that the target is at least partially removable from the chamber in the first direction According to an embodiment, a chamber for physical vapour deposition is provided, which is adapted for receiving at least one target and a substrate. The chamber includes a housing, a door for opening and closing the chamber, and at least one bearing for mounting the target, wherein the bearing is attached to the door.

Further aspects, advantages and features of the present invention are apparent from the dependent claims, the description and the accompanying drawings.

BRIEF DESCRIPTION OF THE DRAWINGS

So that the manner in which the above recited features of the present invention can be understood in detail, a more particular description of the invention, briefly summarized above, may be had by reference to the embodiments. The accompanying drawings relate to embodiments of the invention and are described in the following:

FIG. 1b shows a side view of the example of a simplified chamber geometry of FIG. 1a;

FIG. 2b shows a schematic side view of the physical vapor deposition chamber of FIG. 2a;

FIG. 3b shows a schematic side view of the physical vapor deposition chamber of FIG. 3a;

FIG. 4b shows a schematic side view of the physical vapor deposition chamber of FIG. 4a;

FIG. 5b shows a schematic side view of the physical vapor deposition chamber of FIG. 5a;

FIG. 6b shows a schematic side view of the physical vapor deposition chamber of FIG. 6a;

FIG. 7b shows a schematic side view of the physical vapor deposition chamber of FIG. 7a;

FIG. 8b shows a schematic side view of the physical vapor deposition chamber of FIG. 8a;

FIG. 9b shows a schematic side view of the physical vapor deposition chamber of FIG. 9a;

DETAILED DESCRIPTION OF THE EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Figure 1A:
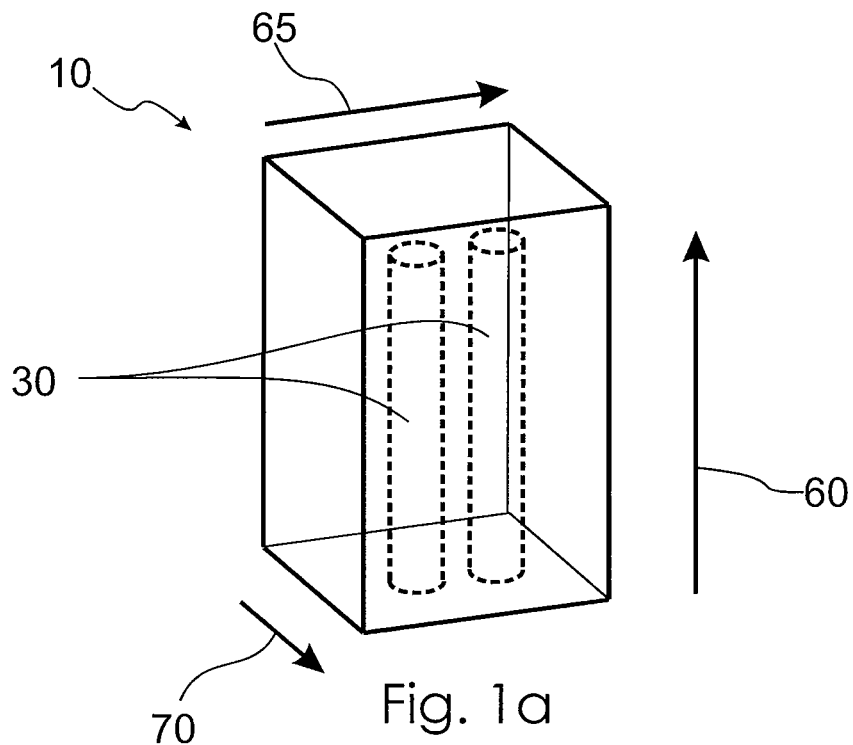
FIG. 1a shows an example of a simplified chamber geometry.
Figure 1B:
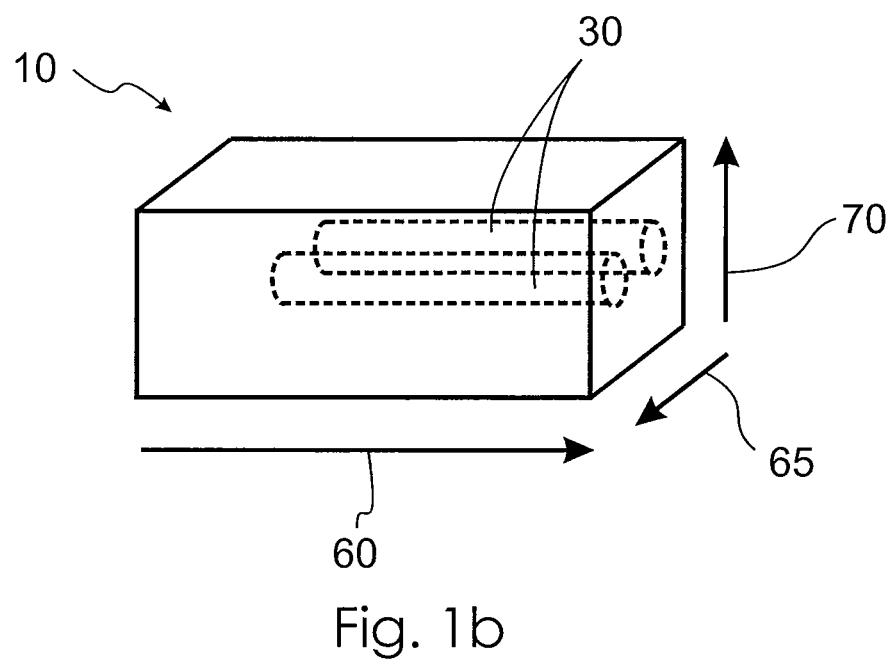

In the following, the directions used in the description are explained. As simplified, but not limiting reference and for explanation of the direction terms used, a schematic example of a closed chamber is shown in FIG. 1a. Exemplarily, targets 30 are shown in dashed lines inside the chamber 10. FIG. 1a shows the chamber in a vertical orientation. FIG. 1b shows the chamber of FIG. 1a in a horizontal orientation.

Direction 60 is denoted as being the first direction. The first direction as used in the following description should be understood as running along the axial direction of a target, which may be mounted in the chamber. The axial direction is normally the longitudinal direction of the target. A second direction 70 is substantially perpendicular to the first direction 60. A third direction 65 is substantially perpendicular to the first direction 60.

The term "substantially perpendicular" in this context means that the angle between the directions being denoted as substantially perpendicular may deviate from a right angle to a certain degree. For instance, the angle between the directions may vary due to a special chamber design.

It can be seen In FIG. 1b that the first, second and third direction are independent of the orientation of the chamber. In the view shown in FIGS. 1a and 1b, directions 60, 70, and 65 are substantially perpendicular with regard to each other. However, the angle between the first, second and third direction may vary according to the design of the chamber.

Figure 2A:
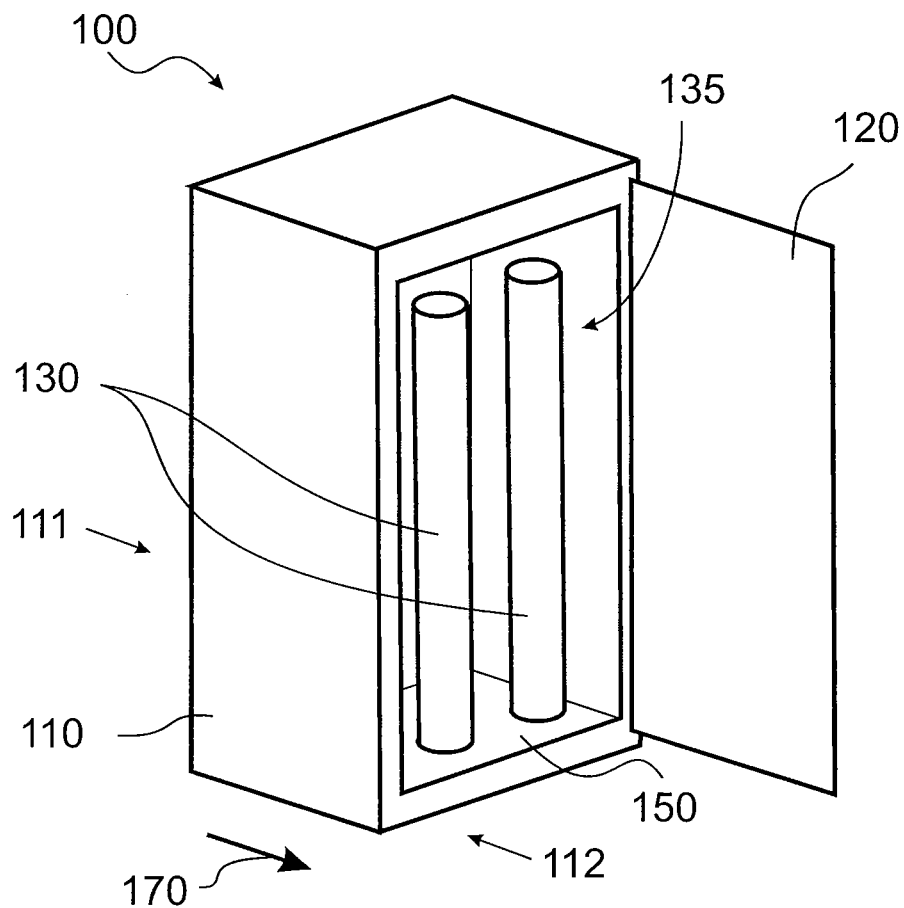
FIG. 2a shows a schematic, perspective view of a physical vapor deposition chamber as known in the art.

FIG. 2a shows a physical vapor deposition (PVD) chamber 100 as known. The chamber 100 includes a housing 110 and a door 120. The door 120 of the chamber 100 is opened and targets 130 can be seen. The door 120 of the chamber 100 is arranged as a flap which is able to cover the door-opening 150 of the housing 110.

Figure 2B:
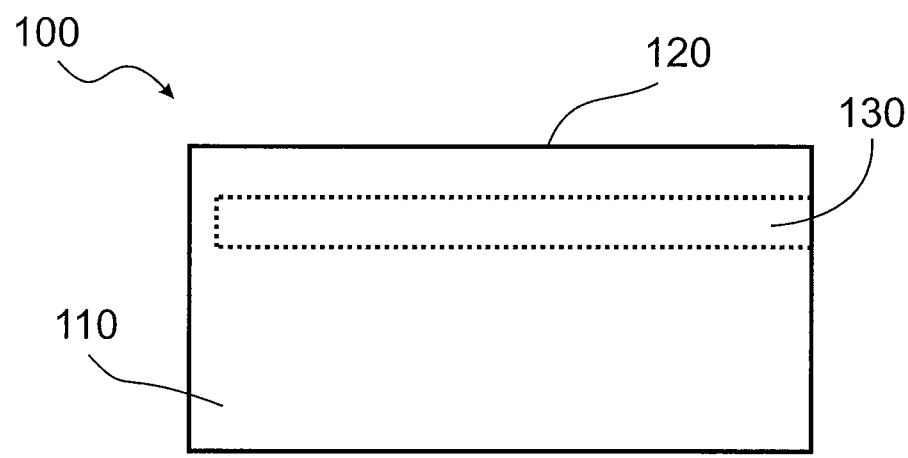

In FIG. 2b, the PVD chamber 100 from FIG. 2a is shown in a side view in a closed position. One of the targets 130 is shown in dashed lines, indicating that the target 130 lies inside the chamber 100.

In this context, the chambers shown are adapted for methods of depositing thin films. Optionally, a vacuum is used in order to deposit material by condensation of a vaporized form of the material. The process may include steps like high temperature vacuum evaporation and plasma generation. The chamber may have devices (not shown) for providing the conditions for a good result of the process, such as vacuum pumps, heaters, cooling devices, gas inlets and outlets and so on.

The cleaning of the chamber is time-consuming and requires an interruption of the deposition process. For the sake of simplifying the cleaning process, a target periphery is often provided. Optionally, the target periphery covers portions of the chamber walls. With the target periphery, the cleaning of the chamber is expedited because the single parts of the periphery are replaced and cleaned outside of the chamber.

Nevertheless, assembly and disassembly of the target is necessary in chambers of known designs for cleaning or replacement purposes of a worn target. The cleaning and replacement processes decrease the effectiveness, regardless of the fact, if the target itself or the periphery of the chamber is replaced.

For instance, when the target should be replaced, the door 120 is opened and the targets 130 can only be reached from a second direction 170 of chamber 100. With other words, the target is removed in a direction which is substantially perpendicular to the longitudinal axis of the target. For removing the target in the second direction 170, which means from the back side 111 to the front side 112 of the chamber, some lifting device has to be provided to lift the target in the second direction 170. Thus, a complicated procedure is to be performed until the target is removed.

For instance, a target as described herein may reach a weight of optionally between 50 kg to 700 kg, more optionally between 100 kg and 600 kg, and even more optionally between 200 kg and 500 kg. Thus, a considerable force is applied until the target is removed in direction 170.

In a further example, the chamber of a known design and thus, the target periphery 135 is cleaned. The door 120 is opened and the targets 130 are in the way for reaching the target periphery and the inner side of the chamber 110. Thus, the targets 130 have to be removed and lifted as described in the previous example, although they might not even be worn. After cleaning the chamber, the target is again placed in the chamber, again using considerable force and technical means for locating the target in the chamber.

The both examples of cleaning the chamber and replacing the target describe laborious processes which have to be performed in certain intervals during the lifetime of a PVD chamber. For instance, a target may be replaced once in a week, when the chamber is used for a sputtering process in display applications. The time period between cleaning procedures may vary, dependent on the used system, process, layer thickness and parameters like that. However, other time ranges may be envisaged for different processes. The cleaning and maintaining postpones the production and may render the production process less effective. The more often these procedures have to be repeated, the more the production process becomes ineffective.

Figure 3A:
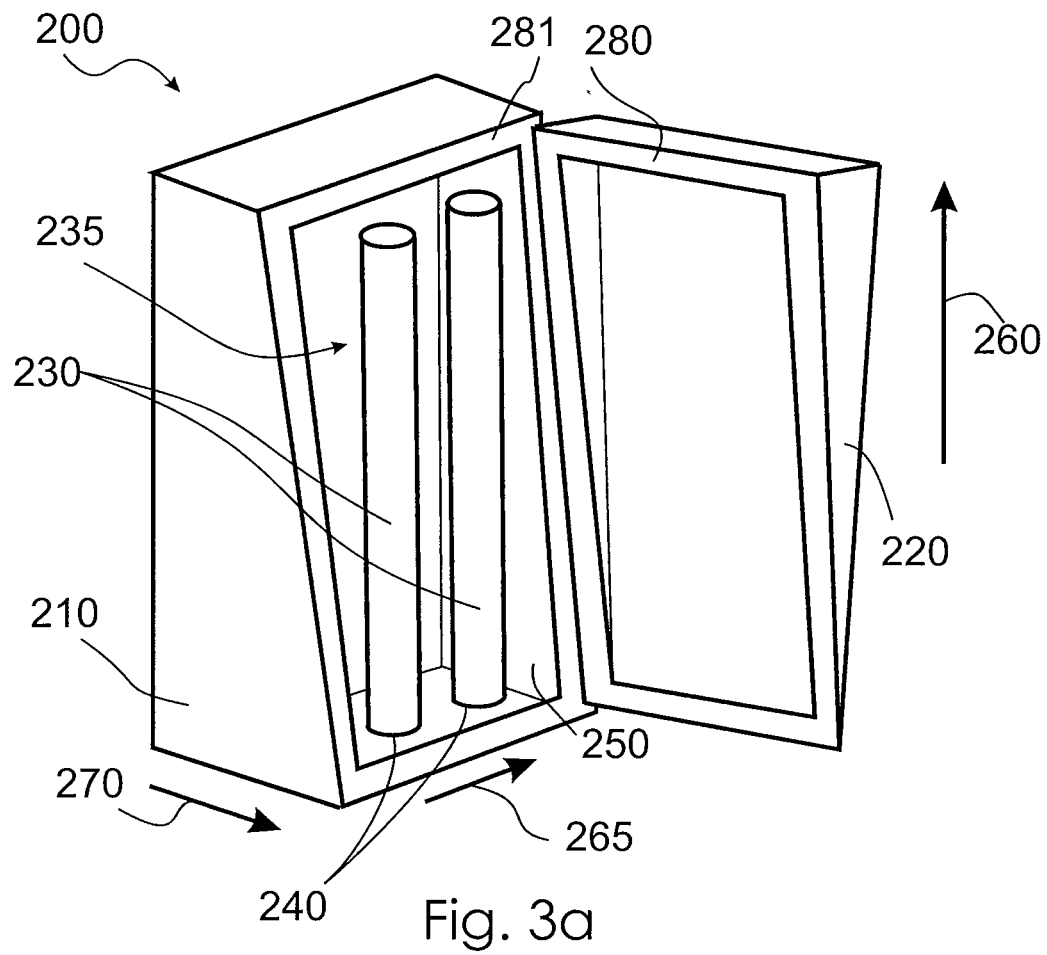
FIG. 3a shows a schematic, perspective view of a physical vapor deposition chamber according to embodiments described herein.

FIG. 3a shows an embodiment as described herein. A PVD chamber 200 is provided, having a housing 210 and a door 220. The chamber 210 is shown in an opened state. The first direction 260 of chamber 200 is shown.

Exemplarily, two targets 230 can be seen in the shown embodiments. According to some embodiments, the number of the targets may be smaller than two. For instance, only one target may be provided. According to further embodiments, the number of targets can be greater than two. For instance, the number of targets can be three, at least three or four.

Optionally, a substrate is located in the housing. The drawings do not show a substrate, for the sake of simplicity. According to some embodiments, there may be just one substrate in the chamber. According to other embodiments, there may be a plurality of substrates. The number of substrates depends on the process used and chamber features, such as chamber size, chamber material, and chamber instruments.

In the described embodiments, the targets 230 have a substantially cylindrical shape. Optionally, the shape of the targets may deviate from a cylindrical shape. The shape of the target or the targets may have any suitable shape, which allows the target material to be deposited on the substrate. For instance, the target can have a substantially rectangular shape, the shape of a plate, a hollow cylinder or the like. According to some embodiments, the target may have a shape adapted for a sputter process using a magnetic field.

The housing 210 has a door-opening 250, through which the inside of the housing can be reached. The access via door-opening 250 is used for cleaning the chamber, for changing parts of the chamber, for maintenance purposes and the like.

Further, the chamber according to embodiments described herein may have several features, such as an inlet for a substrate, an inlet for a process gas, a power supply, vacuum pumps, heaters, cooling devices, drive units, components for rotating targets, devices for generating a magnetic field and the like, which are not shown for the sake of simplicity.

According to the embodiments which can be seen in FIG. 3a, the target is mounted and fixed in the housing 210. The targets 230 are mounted on the bottom side of the housing 210. According to other embodiments, the target 230 can also be mounted on the top side of the housing 210. However, in the described embodiment, the targets 230 are mounted on that side of the chamber that has a greater extension in the second direction 270.

The second and the third direction are substantially perpendicular to the first direction. The second direction can be described as being substantially perpendicular to the plane provided by the door in a closed position.

In case, the plane provided by the door is not evenly shaped, the plane of the door should be understood as the plane whose perpendicular is perpendicular to the first direction.

The third direction can also be described as being the direction in which the targets can be connected via a virtual line. The virtual line connecting the targets is in the plane formed by the second and third direction.

Further, a bearing 240 for the target is provided. Optionally, the number of bearings corresponds to the number of targets.

The bearing is oriented in the first direction 260. It is to be understood that the bearing is able to receive a target with the target's axial direction oriented in the first direction 260. The bearing may have a holding portion which extends in the plane formed by the second and third direction. The holding portion is able to accommodate an end or part of the target.

According to an embodiment, the door 220 and the housing 210 supplement with each other in shape so as to form the chamber 200. Optionally, there are provided mating surfaces 280 and 281 at the door 220 and the housing 210, respectively. The mating surfaces are configured to close the chamber, when mating surfaces 280 and 281 are in contact with each other.

According to some embodiments, mating surfaces of the chambers as described herein may be provided with a sealing device, which ensures the vacuum being maintained in the chamber. The sealing device (not shown) may be a clamp or an elastic material, a combination thereof or any device or material suitable for sealing a PVD chamber.

According to embodiments, which can be combined with other embodiments described herein, the housing and the door overlap to a small extent. For instance, the door and the housing may overlap for sealing purposes or the like.

Figure 3B:
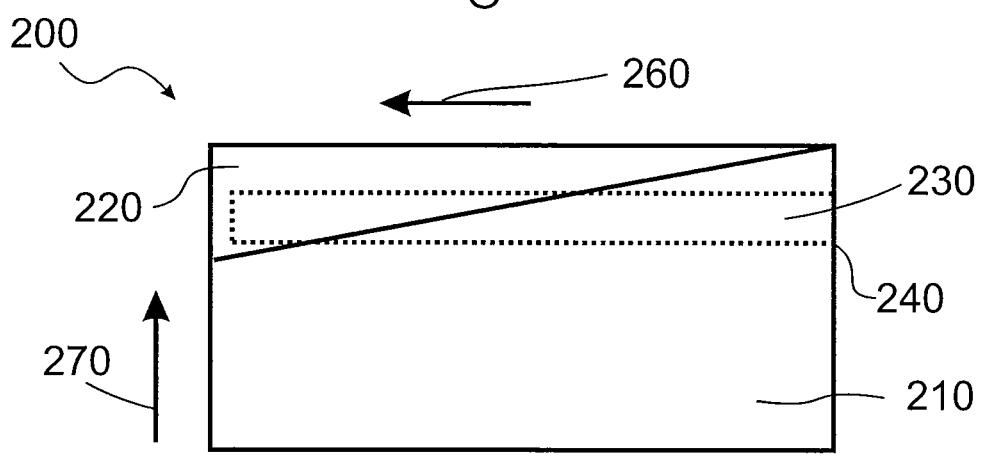

As can be seen in FIG. 3b, the mating surfaces 280 of the door 220 and the mating surface 281 of the housing 210 provide a tapered shape in the first direction 260. The tapered shape allows the targets 230 to be removed from the chamber 200 in the first direction 260. FIG. 3b shows a target 230 in dashed lines to indicate that the target 230 is located and mounted within the chamber.

The tapered shape of the door can also be described as being substantially symmetric with respect to the first direction 260 of the target and asymmetric with respect to the third direction 265. Optionally, the extension of the chamber and the door in the second direction 270 changes over the extension of the chamber in the first direction 260. As can be seen in FIG. 3a, the second direction 270 can also be denoted as the depth of the chamber.

The term "substantially symmetric" as used herein means that the shape of the object being denoted as "substantially symmetric" may vary from the symmetric form to a certain degree. For instance, the chamber may have several devices, such as connectors, inlets, outlets, power supply devices, which are not symmetrically arranged on the chamber. Further, the shape of the substantially symmetric chamber itself may deviate from the symmetry.

The term "asymmetric" means that the shape denoted as being "asymmetric" is not symmetric. For instance, a line separates the chamber in two parts. Asymmetric with respect to this line means that an arbitrary point of one part of the chamber has not the same coordinates with opposite sign as the corresponding point of the other part of the chamber. A corresponding point may be a point having the same, absolute distance to the separating line. Asymmetric does not refer to an object which is denoted as being substantially symmetric.

The schematic side view of a closed chamber of FIG. 3b makes clear how the target can be removed in the first direction. The extension of the door 220 in direction 270 is chosen so that the target 230 can be moved in the first direction 260, i.e. to the left, when considering FIG. 3b. The target 230 is mounted on the right side in the chamber, as can also be seen in FIG. 3b. Optionally, a bearing 240 is provided in the chamber for mounting and holding the target 230.

The side of the chamber in which the bearing is located, or to which the bearing is attached, is denoted as bearing side. According to some embodiments, the side which is opposed to the bearing side in the first direction 260 may be described as being the opposite side of the bearing side. Optionally, an opposite side of a bearing side can be understood as a side of the chamber which faces the bearing side.

Figure 3C:
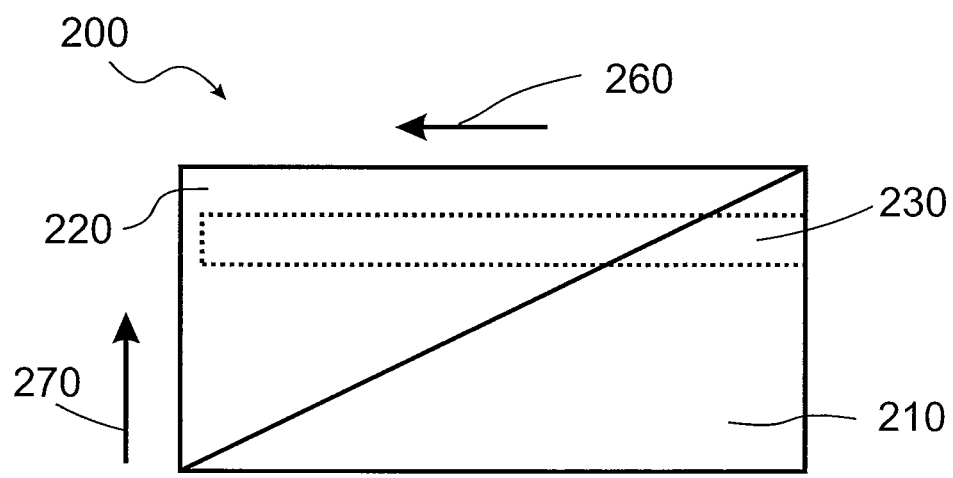
FIG. 3c shows a schematic side view of a physical vapor deposition chamber according to embodiments described herein.

FIG. 3c shows embodiments which can be combined with other embodiments described herein. In the embodiment of FIG. 3c, the door 220 and the housing 210 have substantially the same shape. "Substantially the same shape" means in this context for example that the extension of the door in the second direction 270 at the opposite side of the bearing side is substantially as large as the extension of the housing at the bearing side. The housing 210 and the door 220 may have a similar geometrical shape, but may contain different components for the PVD process.

Normally, and in particular in those cases where the housing and the door have the same shape, the door is considered as that part of the chamber that is adapted to be moved in order to open the chamber. The housing is normally that part of the chamber the position of which is constant. For instance, the housing may be equipped with feet or the like to provide contact to the underground and allow a stable and aligned position. In most embodiments, the door is not provided with comparable means because it is supported by its contact to the housing only.

Optionally, the housing and the door may have a similar shape but are different in size or may be made from different materials or material thicknesses.

According to some embodiments, the extension of the chamber in the first direction can be up to typically between 1.2 m and 3.5 m, more typically between 1.7 m and 3.0 m and even more typically between 2.2 m and 2.7 m.

According to embodiments which can be combined with other embodiments described herein, the cathode or target can reach a length along the axial direction up to typically between 1.0 m to 3.5 m, more typically between 1.5 m to 3.0 m and even more typically between 2.0 m and 2.5 m. The special shape of the chamber described herein allows the target to be moved typically for about 10 mm to 1000 mm, more typically for about 20 mm to 500 mm and even more typically for about 50 mm to 100 mm in the axial direction of the target. By moving the target in the axial direction of the target, i.e. the first direction, the target is removed from the fixed position, resp. out of the bearing. That means that the target can at least partially be removed from the chamber. For instance, the target may be removable for a defined distance out of the bearing, such as removable for 100 mm in direction 260.

After lifting the target for a certain amount in the first direction 260, the cathode may be gripped and removed from the chamber from another direction. According to a further embodiment, the target is removed from the chamber along its whole length in the axial direction of the target or the first direction 260 of the chamber.

According to embodiments described herein, the target periphery 235 of a chamber can easily be reached.

According to embodiments described herein, the target periphery may be the space surrounding the targets at least partially. According to embodiments described herein, which can be combined with other embodiments described herein, the target periphery may refer to components in the space surrounding the target at least partially. Components of a target periphery may be specially shaped sheets, metal sheets, boxes, sheathings or the like. According to embodiments, the target periphery may contain parts for covering the walls of the chamber.

The targets 230 can be mounted on the top side of the housing if the top side of the housing 230 has a broader extent in direction 270 than the bottom side.

A "housing" as used in this context should be understood as a body which houses at least some of the components for conducting a PVD process. For instance, in the housing, there may be located a substrate, parts of a target periphery, gas inlets, gas outlets, power supply components, holding parts for a material to be processed and so on. According to some embodiments, one or more targets are located in the housing. The housing can also be described as being a part of the chamber which is accessible or which can be opened and closed by a door.

When the term "door" is used in this text, the term refers to a member that permits access to a body opened and closed by the door. For instance, by door 220, an operator can access housing 210. Further, the door can close the housing tight, for instance, to enable a vacuum being held inside. According to some embodiments, the door may also include some components such as a bearing for a target, a target, a gas inlet and/or outlet and the like.

Further, in this context, the term "bearing" should be understood as being a component which is able to hold the target. According to some embodiments, a bearing is a component that allows a defined relative movement between two or more parts. The bearing may be a bearing with rolling elements or a plain bearing with rubbing surfaces. According to other embodiments, the bearing is a component which is located in a door or in a wall of a housing and which surrounds the target at least partially. According to other embodiments, the bearing may be just a hole in a door or a wall of a housing, through which the target extends. In such a case, the bearing may have an arbitrary shape.

The term "target" used in this context refers to a piece of material which should be supplied on a substrate or a piece which is coated with the material to be supplied to a substrate. For instance, the target may be made of Al, Mo, MoNb, Ti, AlNd, Cu, CuMn, IGZO, Si, ITO, SiO, Mg, Cr or the like. According to some embodiments, the target can be described as being able to provide the function of a cathode in a PVD chamber.

Figure 4A:
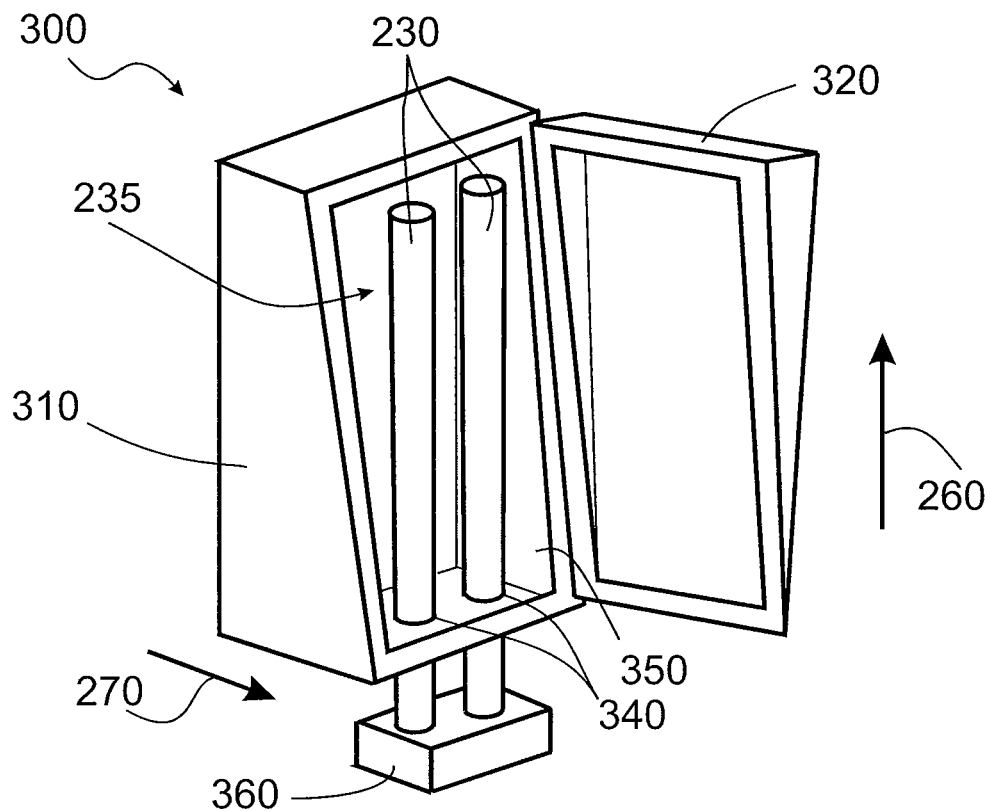
FIG. 4a shows a schematic, perspective view of a physical vapor deposition chamber according to embodiments described herein.
Figure 4B:
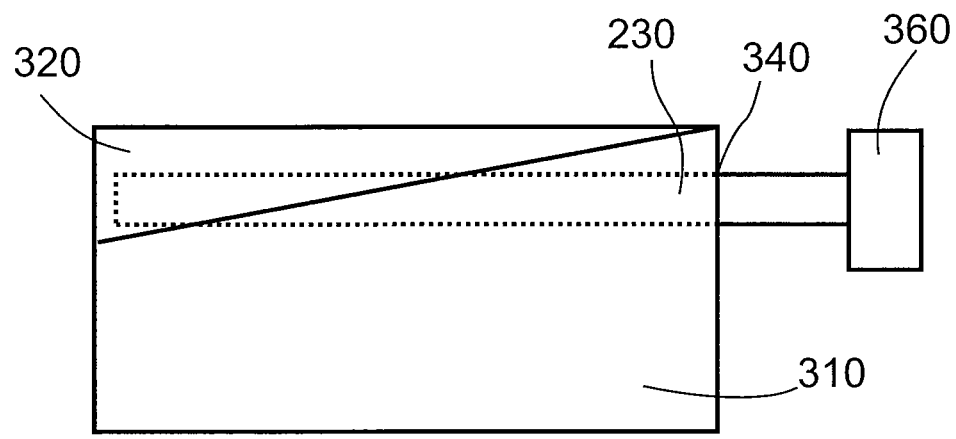

In FIGS. 4a and 4b, a PVD chamber 300 is shown, which resembles chamber 200 of FIGS. 3a and 3b. The chamber 300 has a housing 310 and a door 320, the design of which may essentially be the design as described with reference to FIGS. 3a and 3b or FIG. 3c. Also, the targets 230 may be targets as previously described. However, according to embodiments, the chamber may be adapted for a rotating target. For this purpose, a drive unit 360 is provided and directly or indirectly attached to targets 230. For instance, the chamber may have drive unit devices, such as connectors or the like, helping the drive unit being connected to the targets. The drive unit is able of driving the targets 230. For instance, the drive unit 360 may be a motor causing the targets 230 to rotate.

According to some embodiments, one drive unit may be provided for all targets. According to other embodiments, each target may have a respective drive unit so that each target can be driven independently.

Optionally, the drive unit is adapted for driving components of the chamber. For instance, a drive unit may cause a rotational movement or a pivoting movement, or even a linear movement of the target, the substrate or other components of the chamber, which are driven.

The drive unit 360 can also be seen in FIG. 4b in a side view. The chamber 300 has a bearing 340. Optionally, the drive unit is mounted on the bearing side of the chamber. For instance, if the bearing of the target is on the top side of the chamber according to some embodiments described herein, the drive unit is also located at the top side of the chamber. In other words, the drive unit in the shown embodiment is located on the side of the chamber 300 which is larger in the second direction 270.

Figure 5A:
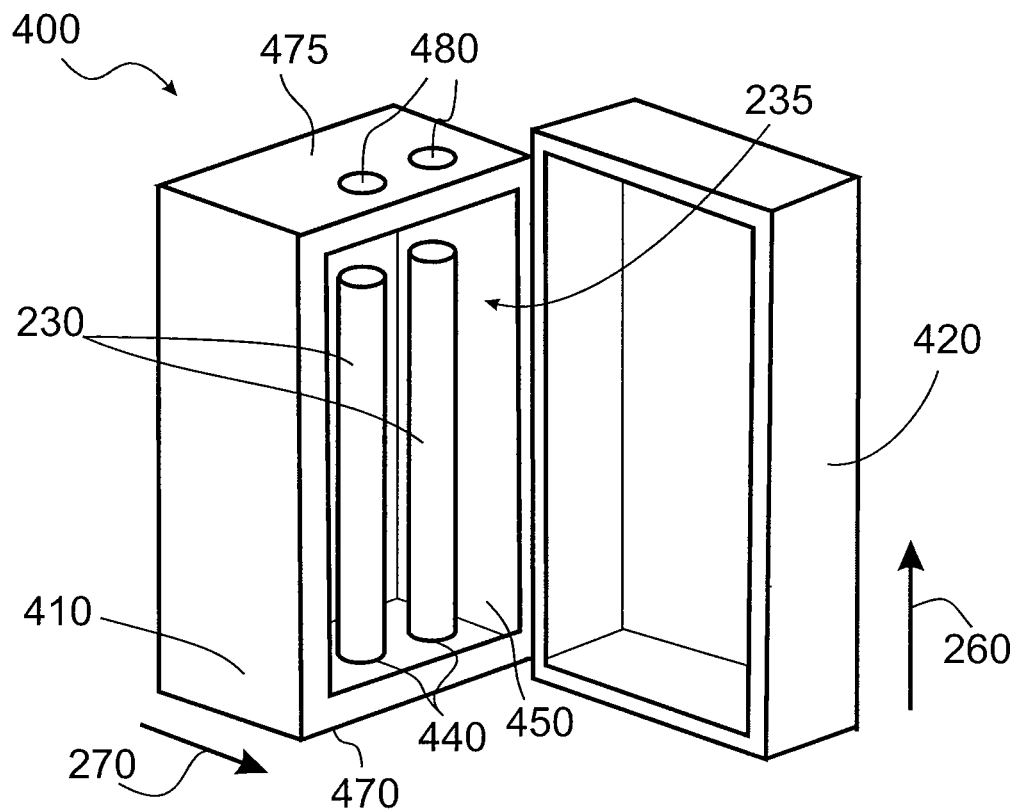
FIG. 5a shows a schematic, perspective view of a physical vapor deposition chamber according to embodiments described herein.

FIG. 5a shows another embodiment of a PVD chamber. A chamber 400 is shown having a housing 410 and a door 420. The door and the housing have a substantially uniform extension in direction 270 over the extension of the chamber 400 in direction 260. The targets 230, which may be the same targets as previously described, are located and mounted in the housing 410. In the housing 410, bearings 440 are provided on the bottom side 470, which can also be described as bearing side in harmony with the above definition. Further, the housing 410 shown in the embodiment provides apertures 480, which are located at the opposite side 475 of the bearing side 470 of the housing 410.

Optionally, the apertures 480 are aligned with the bearings 440, resp. the targets 230. For instance, the apertures 480 are placed in the opposite side 475 on the top of the chamber 410 so that the apertures constitute the virtual elongation of the targets 230. According to one embodiment, the shape of the apertures 480 is similar to the outer shape of the targets 230. For instance, the apertures 480 may have the same shape as the circumference of the targets 230, but the dimension may optionally be slightly greater.

According to an embodiment, the shape of the apertures is different from the shape of the targets 230.

Optionally, the shape of the apertures 480 allows the targets 230 to pass through, when the targets 230 are moved in the first direction 260. Optionally, the apertures 480 can be described as being target apertures. The target apertures may have at least the size of the cross-section of a target. That means the aperture has the size of the dimension of a target in a direction which is perpendicular to the longitudinal axis of the target.

According to some embodiments, only one aperture 480 can be provided. Optionally, the shape of one aperture may be designed so as to allow both targets 230 passing through. If more than two targets are provided, one aperture may be designed so as to allow all targets passing through.

Optionally, the number of apertures 480 corresponds to the number of targets.

According to some embodiments, which are not limited to the embodiment shown in FIG. 5a, the door is adapted to the design of the housing.

Figure 5B:
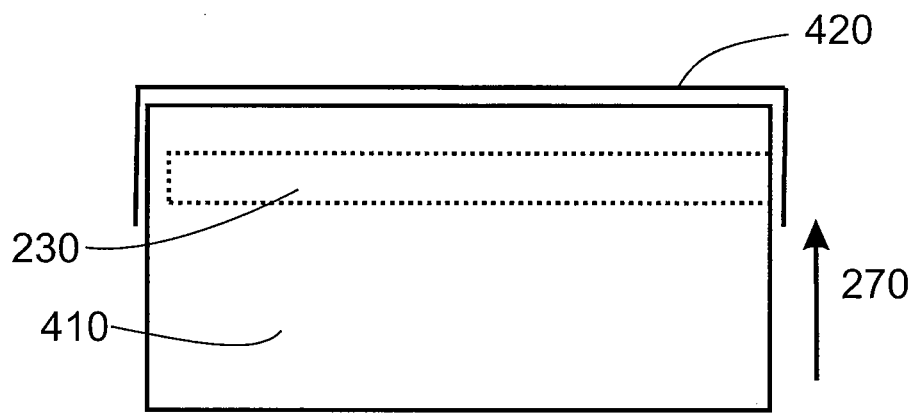

Housing 410 and door 420 have overlapping portions. Optionally, the overlapping portion of the door 420 locks up the target aperture of the housing. As can be seen with reference to FIG. 5b, the door 420 overlaps with the walls of the housing to a predetermined extent. Optionally, the predetermined extent is chosen so that the door is able to lock up the chamber. By locking up the chamber, and particularly the apertures of the chamber, by the door, the desired conditions in the chamber, such as temperature, pressure, gas content etc, can be maintained in the chamber. Therefore, the door 420 overlaps with the housing in the second direction 270 at least as far as the apertures 480 reach so that the apertures 480 are completely covered by the door 420 in a closed state.

According to some embodiments, the door and the housing do not overlap for covering the apertures, but locking devices may be provided which are able to close the apertures. The devices adapted to cover the target aperture/apertures may be a flap, a seal, a barrier, a metal sheet, a small door or the like.

Figure 5C:
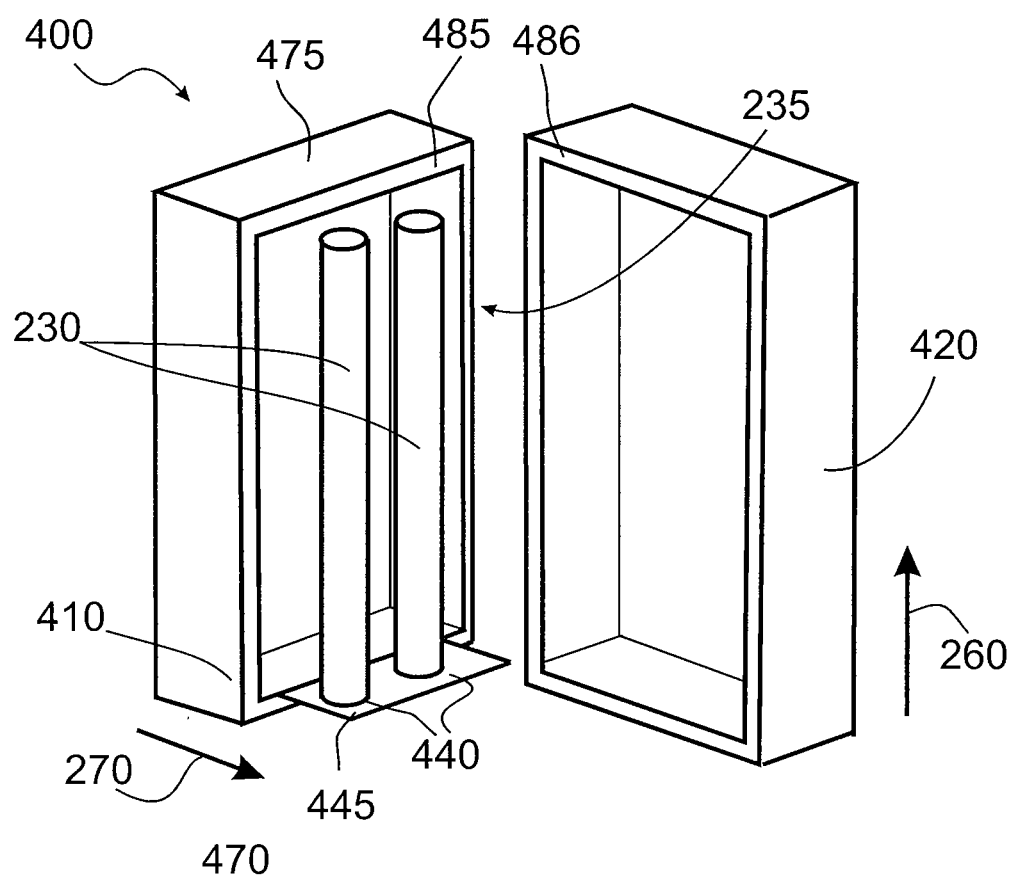
FIG. 5c shows a schematic perspective view of embodiments of a physical vapor deposition chamber according to embodiments described herein.

FIG. 5c shows a chamber according to some embodiments described herein. The door 420 and the housing 410 have mating surfaces 485 and 486, respectively. The mating surfaces 485 and 486 are in contact when the chamber is closed. According to embodiments described herein, the targets 230 are mounted on a holding device 445 of housing 410, which is—in a closed state—at least partially located within door 420. The bearings 440 for the targets 230 are also located in the holding device 445.

According to embodiments, the holding device may be a sheet made of the same material as the chamber. The holding device is adapted for carrying the bearings for the targets. According to some embodiments, the holding device may be made of any material suitable for carrying the bearing. According to some embodiments, the holding device is adapted for carrying the targets.

The removal of the target from the chamber is facilitated by the design of the chamber. By using the described design, the target can be removed from the chamber in the first direction 260, i.e. in an axial direction of the target.

Figure 6A:
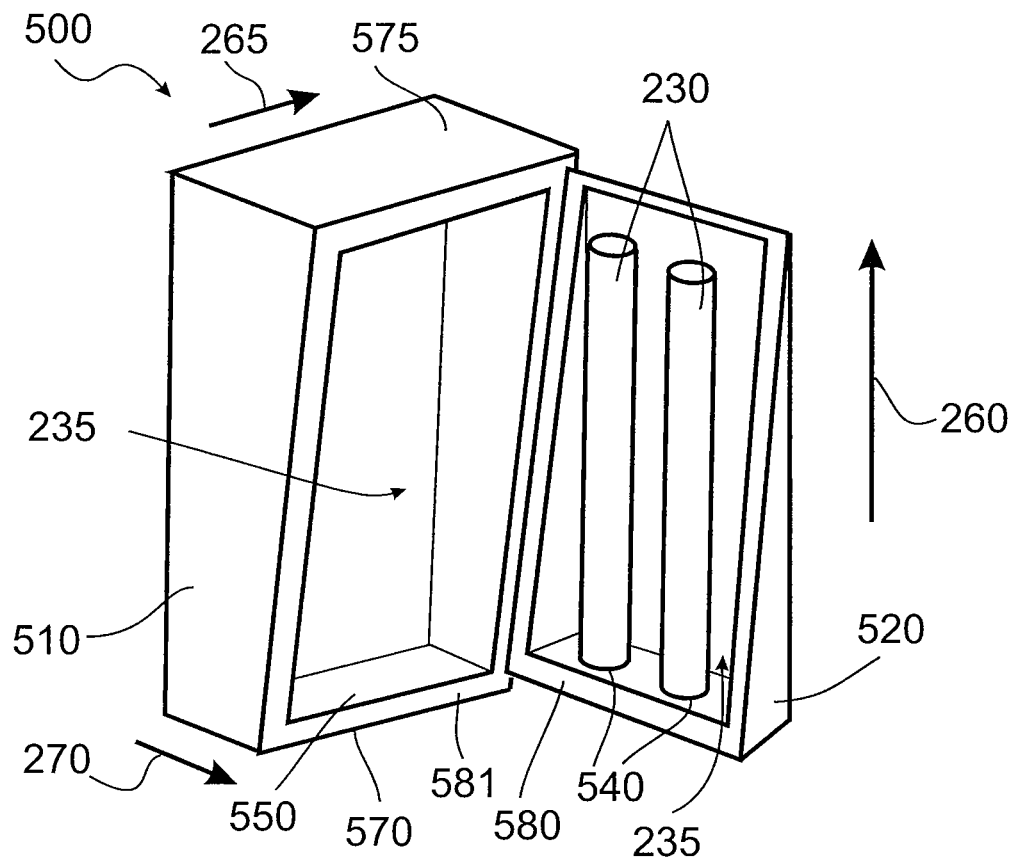
FIG. 6a shows a schematic, perspective view of a physical vapor deposition chamber according to embodiments described herein.

In FIG. 6a, embodiments as described herein can be seen. Chamber 500 provides a housing 510 and a door 520. The chamber 510 is shown in an opened state.

The door 520 and the housing 510 may have a shape similar to the shape described with respect to FIGS. 3a and 3b.

According to an aspect, the door 520 and the housing 510 supplement with each other in shape so as to form the chamber 500. Optionally, there are provided mating surfaces 580 and 581 at the door 520 and the housing 510, respectively. The mating surfaces 580 and 581 are configured to close the chamber, when the mating surfaces 580 and 581 are in contact with each other.

According to some embodiments, mating surfaces of the chamber may be provided with a sealing device, which ensures the vacuum being maintained in the chamber. The sealing device (not shown) may be a sort of clamp or an elastic material, a combination thereof or any device or material suitable for sealing a PVD chamber.

According to embodiments, which can be combined with other embodiments described herein, the housing and the door overlap to a small extent. For instance, the door and the housing may overlap for sealing purposes or the like.

The housing 510 has a door-opening 550, through which the inside of the housing can be reached. The door-opening 550 may be used for accessing the chamber for cleaning the chamber, changing parts of the chamber, maintenance purposes and the like.

As can be seen in FIG. 6a, the extension of the chamber and the door in the second direction 270 changes over the extension of the chamber in the first direction 260. Optionally, the shape of the mating surfaces 580 and 581 can be described as being tapered. In other words, the door 520 is substantially symmetric with respect to the first direction 260 of the target and asymmetric with respect to a third direction 265.

According to further embodiments, the shape of the housing may be similar to the shape of the door. For instance, the housing is substantially symmetric with respect to the first direction and asymmetric with respect to the second direction 270.

Optionally, the door and the housing may have substantially the same shape. An example is shown in FIG. 3c. In the embodiment of FIG. 3c, the door 520 and the housing 510 have substantially the same shape. In other words, the extension of the door in the second direction 270 at the opposite side of the bearing side is substantially as large as the extension of the chamber at the bearing side. The housing 510 and the door 520 may have a similar geometrical shape, but may contain different components for the PVD process. According to embodiments, which can be combined with other embodiments described herein, the housing and the door may have a similar shape but are different in size or may be made from different materials or material thicknesses. The geometry shown in FIG. 3c may also be applied to a PVD chamber as described with respect to FIGS. 6a and 6b. That means, the geometry of the chamber may be as shown in FIG. 3c, but the targets 230 are provided in the door, as shown in FIG. 6a.

Although FIG. 6a shows exemplarily that the extension in the second direction 270 of the chamber is smaller at the bottom side 570 and larger at the top side 575, a housing according to embodiments described herein may be constructed vice versa, i.e. with the larger extension in the second direction 270 at the bottom side 570 and the smaller extension in the direction 270 at the top side 575. The same is valid for the geometry of the door.

According to some embodiments, which are not limited to the embodiment shown in FIG. 6a, the targets 230 are mounted in the door. The door 520 has a bearing 540 for mounting the target. The bearing 540 may be attached to the door. Optionally, the bearing may be located in the door. According to embodiments, the bearing may be part of the door. Optionally, the bearing can also be otherwise applied to the door, dependent on the type of bearing used. The type of bearing depends in turn on the target and may vary according to the process to be performed.

The targets may be the same as described above with reference to FIGS. 3a and 3b. The targets 230 are mounted on the side of the door that has the larger extension in the second direction 270. Thus, in the embodiment, the targets 230 can be mounted on the bottom side 570 of the door 520. According to an embodiment, in which the extension of the door in the second direction 270 is larger at the top side, the targets 230 would be mounted on the top side 575 of the door.

Figure 6B:
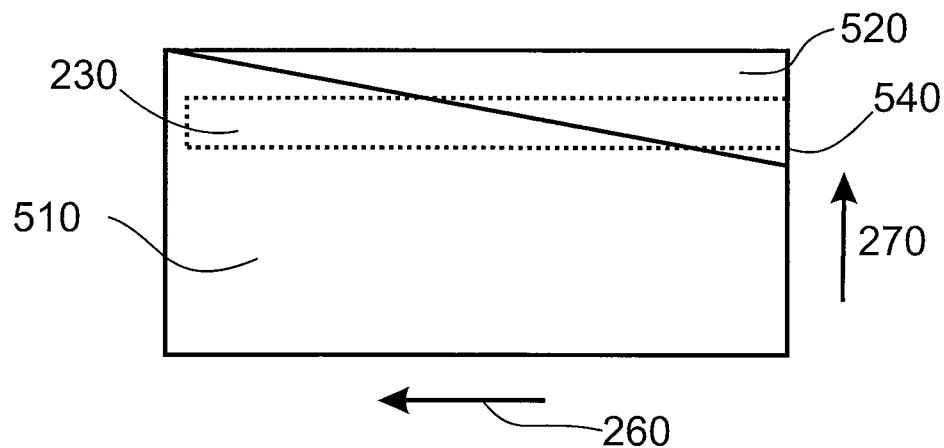

The side view of the chamber in a closed position in FIG. 6b shall illustrate how the door 520 is shaped in relation to the housing 510. As the target 230 is mounted in the door, and extends in the first direction 260 into the housing, the target 230 is removed from the housing 230 by opening the door. Thus, at least one side of the door includes a bearing 540 for placing the target therein.

The side including a bearing is denoted as the bearing side. According to some embodiments, the side, which is opposed to the bearing side in the first direction 260, may be described as being the opposite side of the bearing side. Optionally, an opposite side of a bearing side can be understood as a side of the chamber which faces the bearing side. The bearing may allow the target to be rotated around its longitudinal axis.

Further, the targets 230 of the embodiment shown in FIG. 6b can also be removed from the chamber in the first direction 260, which is especially useful when the target has to be replaced. According to some embodiments, the technique for removing the target 230 from the chamber 500 resembles the technique used in embodiments described with regard to FIGS. 3 to 5. Thus, the chamber 500 enables the user to have a further possibility of removing the target from the chamber.

For instance, if the user wants to clean the chamber, the door 520 of chamber 500 is opened and the periphery 235 of the target can directly be accessed and removed or cleaned. The target is not taken from the bearing 540, when the chamber is cleaned.

According to a further example, if a user wants to replace a worn target, the door 520 is opened and the target 230 can be removed in the first direction 260, i.e. to the left when seen in the perspective of FIG. 6b. Removing the target in either the first direction or by opening the door makes the removal of the target easy and straightforward.

The chamber-door combination according to the embodiments exemplarily illustrated with respect to FIGS. 6a and 6b allows for easy disassembly and removal of the target 230, in the case the target has to be exchanged and/or the chamber has to be cleaned. For instance, the door can be opened and the targets 230 can be removed by moving them in the first direction 260. Further, the targets 230 can be removed from the chamber, resp. the processing region in the housing by one step, namely by opening the door 520, thus facilitating and accelerating cleaning of the chamber and replacement of parts being located in the chamber 500.

A "processing region" as used in this context should be understood as a region within the chamber, where the physical vapor deposition process takes place. During operation, the processing region may, for instance, contain the substrate, the target and a gas, resp. the plasma of the gas. The processing region is defined as an inner part, or even the whole inside of the PVD chamber.

Figure 7A:
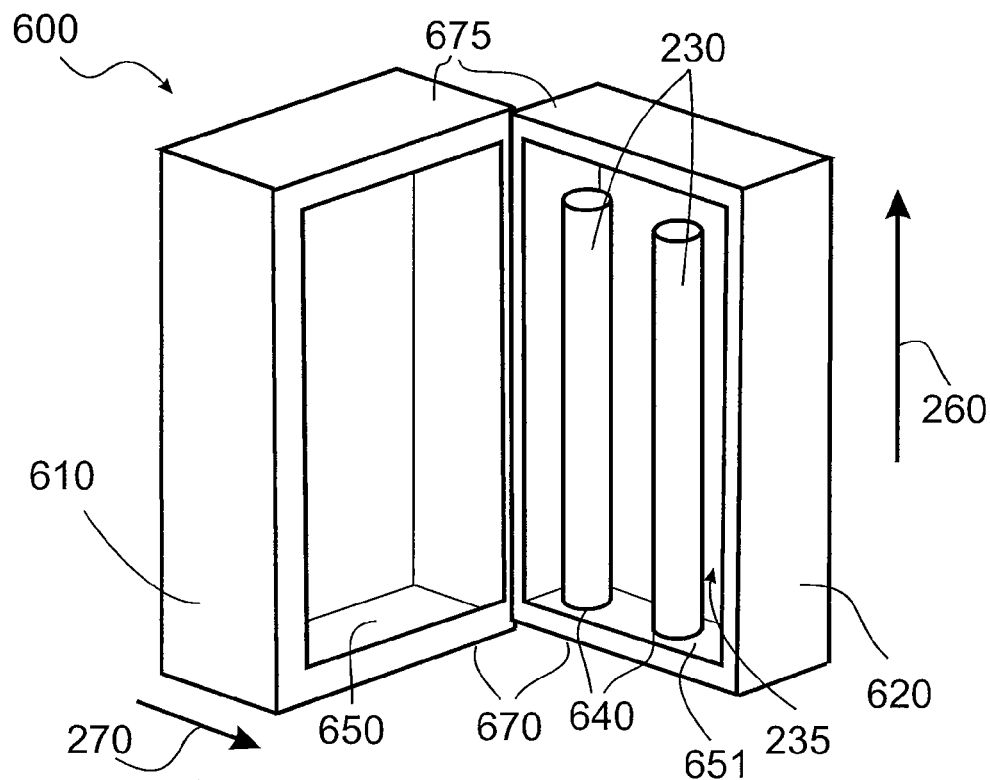
FIG. 7a shows a shows schematic, perspective view of a physical vapor deposition chamber according to embodiments described herein.
Figure 7B:
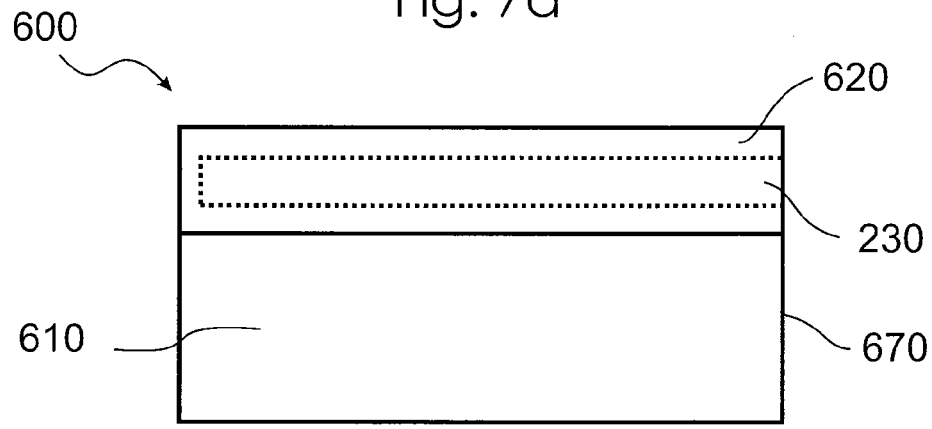

An embodiment described herein is shown in FIGS. 7a and 7b. In the embodiment, the chamber 600 has a housing 610 and a door 620, which both have a substantially uniform extension in direction 270 over the extension of the chamber 600 in the direction 260. Targets 230 are provided in the chamber 600. The targets 230 may be the same as described with respect to FIGS. 3a and 3b or 6a and 6b. According to the embodiment shown in FIG. 7a, the targets 230 are mounted in the door 620.

As can be seen in FIG. 7a, the targets 230 in the embodiment are mounted and held at the bottom side 670 of chamber 600. In an alternative embodiment, the targets 230 may also be mounted and held at the top side 675 of chamber 600. A bearing 640 is provided in or attached to the door 620 for allowing the targets 230 to move or for being held in a fixed position in the door 620, and thus, in the chamber 600.

In the embodiments exemplarily illustrated with respect to FIGS. 7a and 7b, the targets 230 do not extend into the housing or not to a great extend due to the arrangement of the bearings 640 in the door 620. However, parts of the targets 230 may extend in the housing 610 if the bearings 640 are arranged near the opening 651 of door 620. Nevertheless, the same terminology is used in the following as in the previously described embodiments and the targets 230 are "removed from the housing". According to the embodiment shown in FIGS. 7a and 7b, the term "removed from the housing" rather means "is removed from the processing area within the chamber."

FIG. 7b shows the chamber 600 in a closed state in a side view. The position of the targets 230 within chamber 600 can be seen in dashed lines. Thus, also the chamber described in the embodiment of FIG. 7b allows for removing the target 230 from the housing by opening the door 620.

Figure 8A:
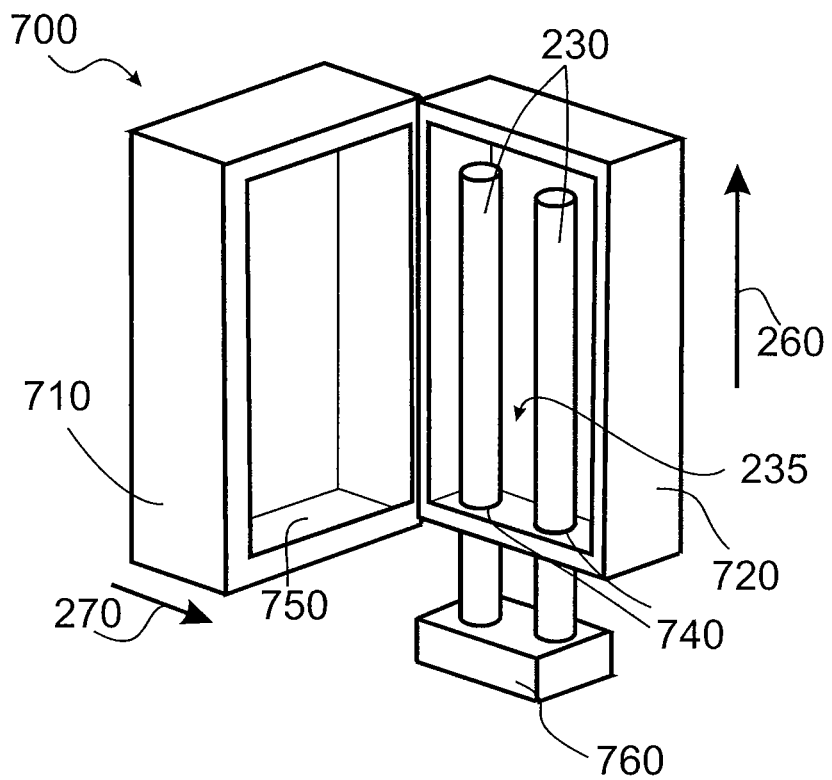
FIG. 8a shows a schematic, perspective view of a physical vapor deposition chamber according to embodiments described herein.
Figure 8B:
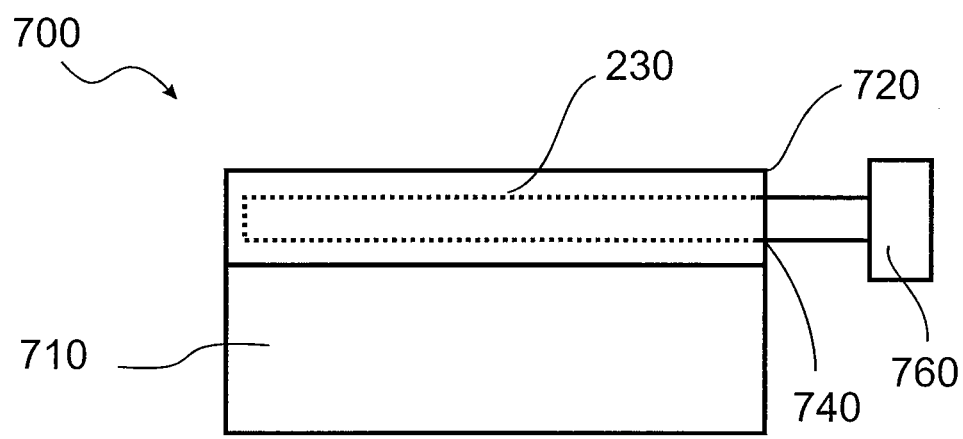

FIGS. 8a and 8b show substantially the same chamber as described with respect to FIGS. 7a and 7b, but having a drive unit 760 for driving the targets 230. According to embodiments, which can be combined with other embodiments described herein, the chamber is adapted for a rotating target. For instance, the chamber may have drive unit devices, such as connectors or the like, helping the drive unit being connected to the bearing 740 of the targets or the targets themselves. For the purpose of driving a target, a drive unit 760 is provided and directly or indirectly attached to targets 230. The drive unit is able of driving the targets 230. For instance, the drive unit 760 may be a motor causing the targets 230 to rotate.

According to some embodiments, one drive unit may be provided for all targets. According to other embodiments, each target may have a respective drive unit so that each target can be driven independently. For instance, the drive unit or the plurality of drive units may cause a rotational movement or a pivoting movement, or even a linear movement of the target.

The drive unit 760 can also be seen in FIG. 8b in a side view. According to some embodiments, the drive unit 760 can be mounted at the bottom side of the chamber. Optionally, the drive unit is mounted on the side of the bearing 740 of the targets. For instance, if the bearing 740 of the target is on the top side of the chamber according to some embodiments described herein, the drive unit is also located at the top side of the chamber.

According to embodiments, the drive unit 760 may at least partially move with the door if the door is opened. According to some embodiments, the drive unit 760 may be decoupled from the targets 230, before the door is opened.

Figure 9A:
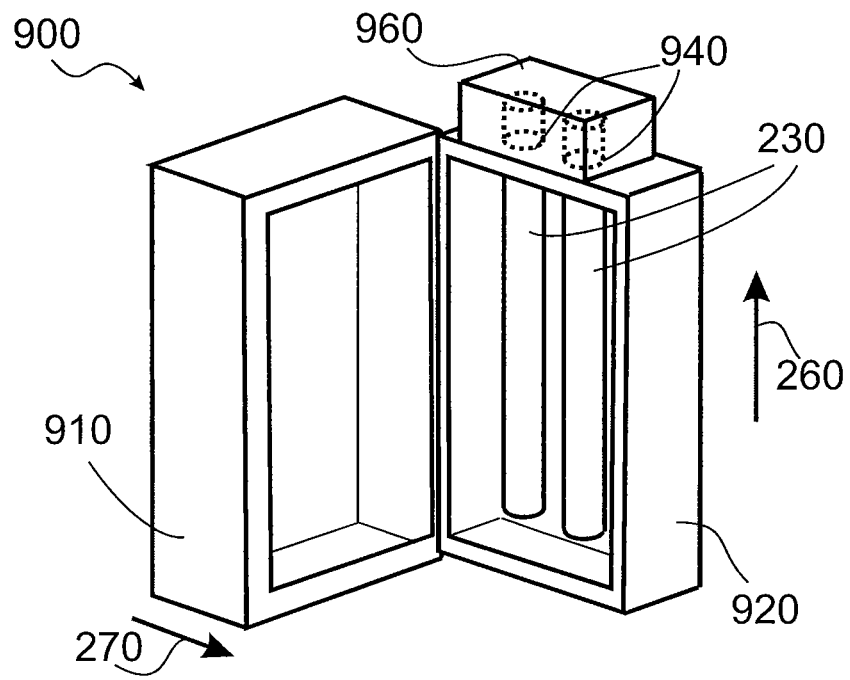
FIG. 9a shows a schematic, perspective view of a physical vapor deposition chamber according to embodiments described herein.

FIG. 9a shows a schematic drawing of an embodiment of a PVD chamber. The chamber 900 provides a housing 910 and a door 920. Two targets 230 are shown in the door 920. Generally, the targets 230 are exemplarily shown as being mounted in the door, but should not to be understood as being part of the door. The bearings 940 for the targets 230 are located in the door 920. A drive unit 960 is located adjacent to the door 920 in the embodiment shown in FIG. 9a. Optionally, the drive unit 960 may be adapted for driving rotatable targets or the like. According to some embodiments, the drive unit 960 may include a driving device, a motor, parts of a control system, bearings, connectors or the like.

In FIG. 9a, the chamber 900 is shown in an opened state. Optionally, the drive unit 960, being attached to the door 920, stays in the same relation to the door, irrespective of the fact, whether the chamber is closed or opened.

According to some embodiments, which can be combined with other embodiments described herein, the targets 230 may have a greater extension in direction 260 than the substrate in the housing. For instance, the targets 230 may exceed the housing 910 in direction 260 by a certain amount. The exceeding amount may be chosen according to process parameters such as deposition material, substrate material, type of application etc.

Figure 9B:
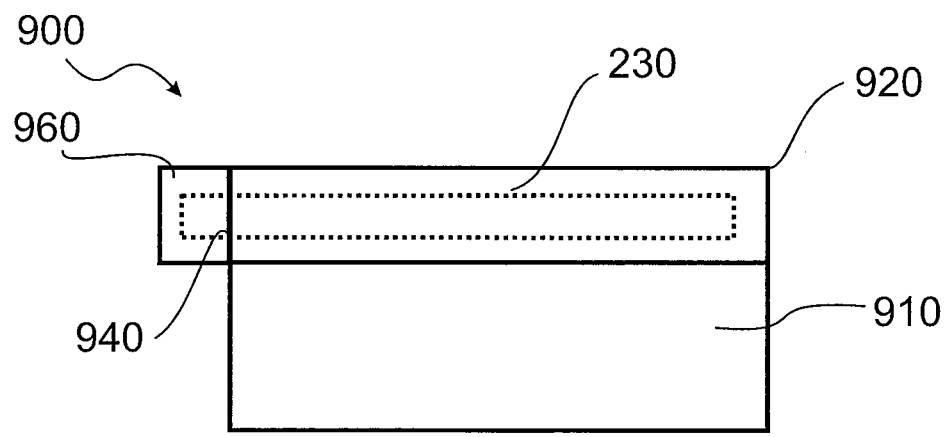

FIG. 9b shows a schematic side view of the chamber 900 shown in FIG. 9a in a closed state. The drive unit 960 is attached to the door 920 in the embodiment of FIGS. 9a and 9b. The target 230, which can be seen in dashed lines in the side view of FIG. 9b, extends in the drive unit 960. The bearing 940 of the target is located in the door 920.

Figure 9C:
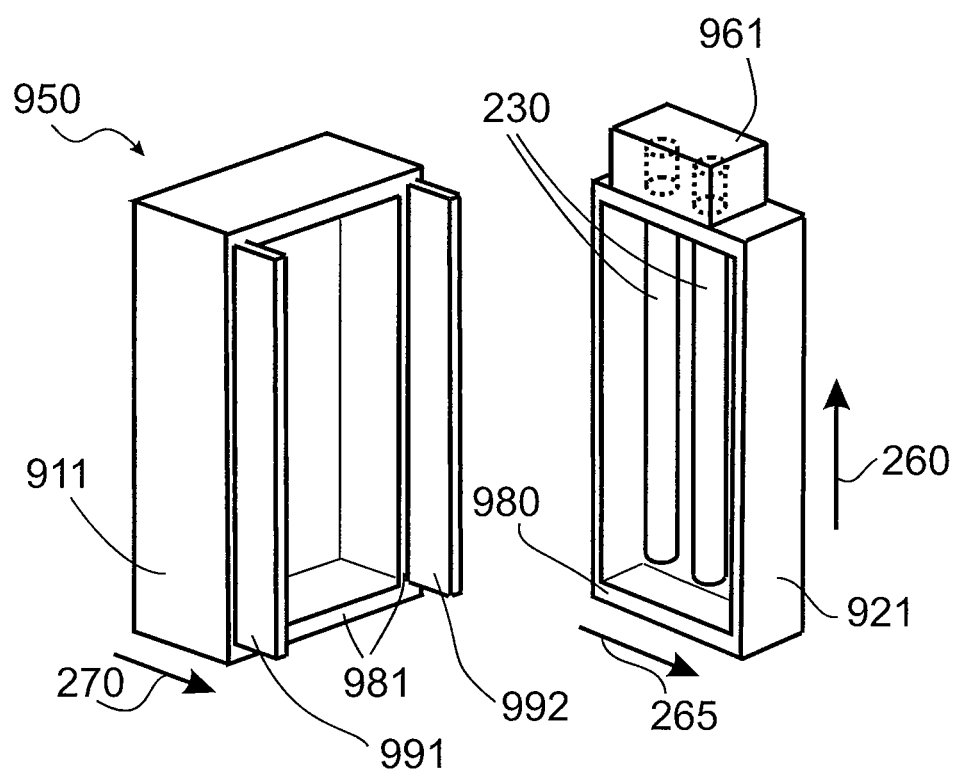
FIG. 9c shows a schematic, perspective view of a physical vapor deposition chamber according to embodiments described herein.

FIG. 9c shows a perspective view of an embodiment of a PVD chamber. The chamber 950 has sidewalls 991 and 992. For instance, the sidewalls may be designed to be reinforcing ribs extending in direction 270. In a closed state, the sidewalls may be substantially parallel to the sidewalls of the door in direction 270. According to some embodiments, the door 921 may at least partially be located within the housing 911 in a closed state so that the ribs and the door have overlapping portions. Optionally, the door 921 may lie between the sidewalls 991 and 992, when the chamber 950 is closed. The housing 911 has a circumferential mating surface 981 for matching with a corresponding mating surface 980 of the door 921. The mating surface of the door and the mating surface of the door may be used to seal the chamber, for instance to ensure that the process parameters are maintained during processing.

According to some embodiments, the door 921 is adapted to the shape of the housing 911 and the sidewalls 991 and 992. For instance, the door 921 may have an extension in the third direction 265, which is adapted to the distance of the sidewalls to each other in the third direction 265. The extension of the door in the third direction 265 may be adapted so as to fit between the sidewalls 991 and 992 of housing 911.

In FIG. 9c, the chamber 950 may be opened in several ways. For instance, the door 921 may be opened by means of a hinge-like device and may be swung open as for instance shown in FIG. 9a described above. Optionally, the chamber 950 door may be opened by moving the door 921 in the first direction, which is denoted by arrow 260 in FIG. 9c.

According to embodiments not limited to the embodiments illustrated in FIG. 9c, the door is configured to be opened in the target's longitudinal direction, i.e., in the first direction. In the embodiment of FIG. 9c, the door 921 may be lifted in direction 260 to open the chamber 950 and/or for replacement or maintenance purposes. Optionally, the door is adapted for being moved in the first direction 260.

Generally, also the doors of other embodiments described herein may be lifted in direction 260 to access the inside of a chamber, when the geometrical construction of the door and the chamber allow for lifting the door in direction 260.

According to some embodiments, which can be combined with other embodiments described herein, a PVD chamber as described herein may have more than one door. For instance, a chamber may be provided with one housing and three doors.

Figure 10A:
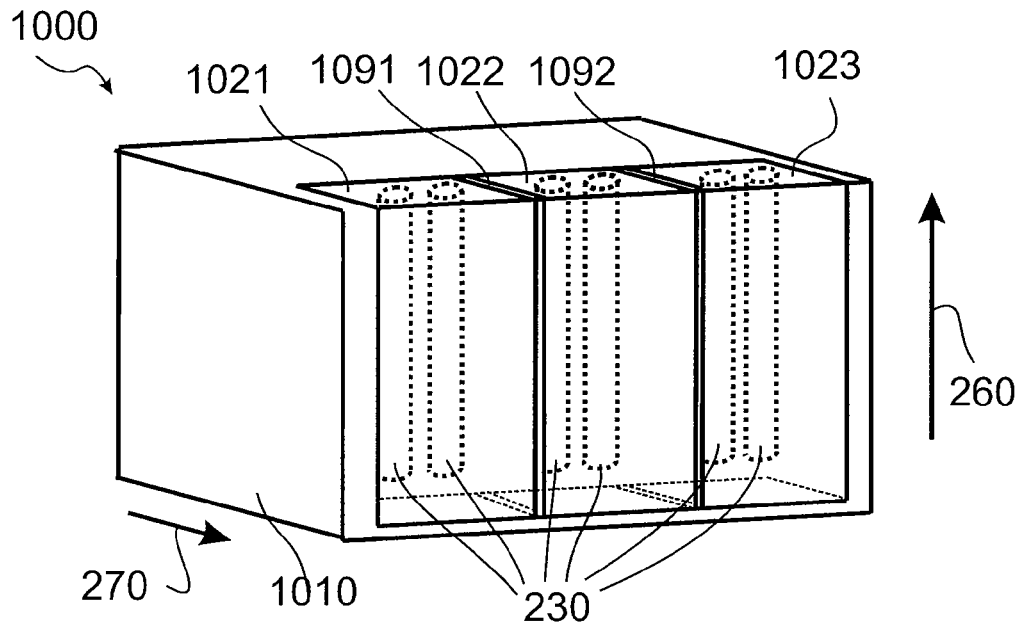
FIG. 10a shows a schematic, perspective view of a physical vapor deposition chamber according to embodiments described herein.

FIG. 10a shows an embodiment of a PVD chamber 1000 having more than one door. The chamber 1000 is shown in a closed state and includes a housing 1010 and, exemplarily, three doors 1021, 1022, and 1023. The number of the doors may vary according to the chamber design, the substrate to be coated, the used process etc. In each door 1021, 1022, 1023 of the embodiment shown in FIG. 10a, two targets 230 are mounted. According to some embodiments, there may be just one target mounted in one door. Optionally, more than two targets may be mounted in one door. The doors are shown being designed as described with respect to FIGS. 9a and 9b, but may also be designed like the doors described above with respect to other embodiments.

Generally, the number of doors may be related to the number of targets. For instance, in case, the targets are mounted in the housing according to some embodiments described herein, a defined number of targets such as one, two, or even three, can be accessible via one door. In the embodiment shown in FIG. 10a, two targets 230 can be accessed by each of the doors 1021, 1022, and 1023.

Figure 10B:
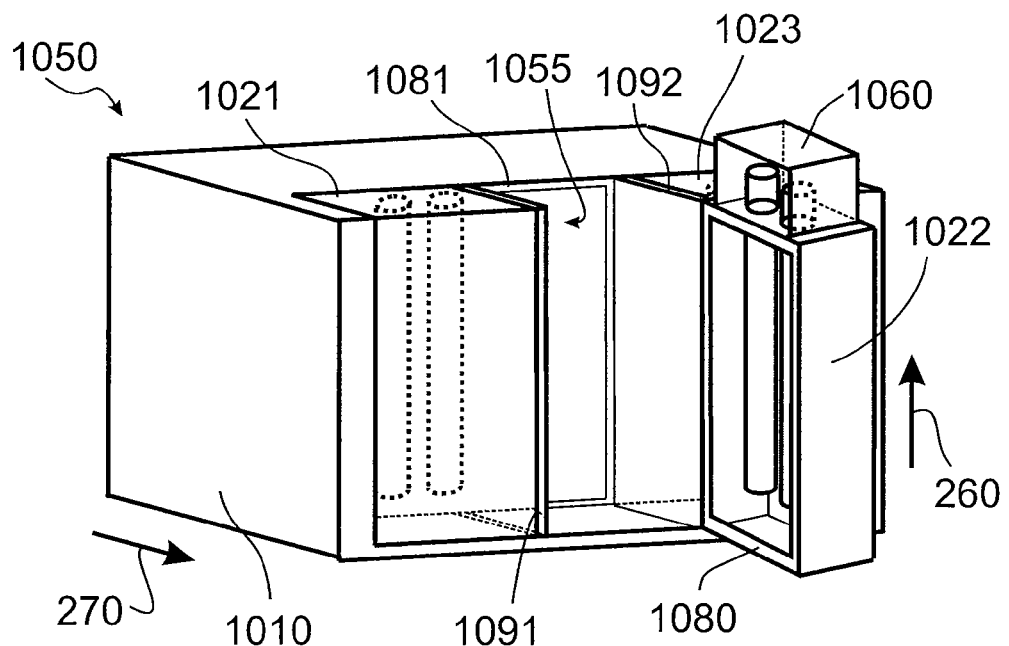
FIG. 10b shows a schematic, perspective view of the physical vapor deposition chamber of FIG. 10a in an opened state according to embodiments described herein.

In FIG. 10b, the same chamber is shown as in FIG. 10a, but one door 1022 is shown in an opened state. The door 1022 has a drive unit 1060 being adjacent to it. According to some embodiments, the other doors 1021, 1023 of chamber 1000 or chamber 1050 may also have a drive unit 1060 like door 1022. For the sake of simplicity, the drive unit is only shown with door 1022.

In the opened state of the chamber 1050, mating surface 1080 of the door 1022 and mating surface 1081 of the housing 1010 can be seen. The mating surfaces are configured to close the chamber, when mating surfaces 1080 and 1081 are in contact with each other. According to some embodiments, the mating surfaces 1080 and 1081 of the chamber 1050 may be provided with a sealing device, which ensures that the process parameters such as a vacuum are maintained in the chamber. The sealing device (not shown) may be a clamp or an elastic material such as an o-ring, a combination thereof or any device or material suitable for sealing a PVD chamber.

According to some embodiments, the chamber 1050 provides several sidewalls, two of which are shown in FIGS. 10a and 10b as sidewalls 1091 and 1092. The sidewalls may be reinforcing ribs or the like and may separate the doors 1021, 1022, and 1023 from each other.

The inside of the housing 1010 of the chamber 1050 can be accessed through one or more door-openings of the housing 1050. One door opening 1055 can be seen in FIG. 10b. The door-opening 1055 thus provides a sort of window to the processing region, in which a substrate is treated.

Optionally, the chamber 1010 may also be opened by lifting the door 2022 in direction 260 for replacement or maintenance purposes.

In some embodiments, a lifting device such as a crane or the like can be provided for opening the doors and for accessing the inside of the PVD chamber for replacement and/or maintenance purposes. For instance, one or more of the above described PVD chambers may be located in a system or a line for multiple or large applications for substrate treatment. The system may provide one crane having several arms for accessing each single target of the chambers from a top side in direction 260.

Figure 11A:
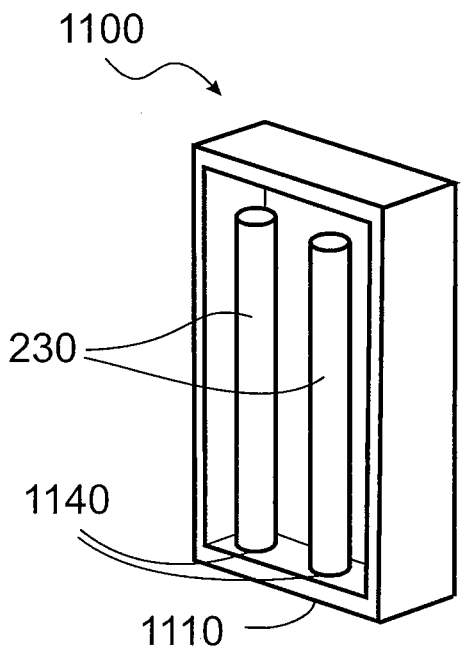
FIG. 11a shows a schematic, perspective view of a door for a physical vapor deposition chamber according to embodiments described herein.

FIG. 11*a* shows a door 1100 for a PVD chamber. Targets 230 are provided in the door, being similar or the same as the targets previously described. The targets 230 are mounted in the door by means of bearings 1140.

The shape of the door shown in FIGS. 8*a* and 8*b* are exemplarily and can suitably be adapted. For instance, the shape of the door may be adapted as to match with chamber 500 of FIG. 6*a*.

Figure 11B:
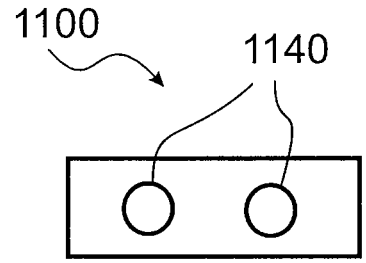
FIG. 11b shows a bottom view of the door for a physical vapor deposition chamber of FIG. 11a; and, FIG. 12 shows a schematic, perspective view of a door for a physical vapor deposition chamber according to some embodiments described herein.

In FIG. 11*b*, the door 1100 can be seen, from a side view, in particular from side 1110, as indicated in FIG. 11*a*. In the embodiment shown in FIG. 11*b*, the bearings 1140 of the door 1100 can be seen as holes going through the wall of side 1110 of door 1100. Optionally, the targets can extend through the bearings 1140 and continue on the outside of door 1100 of the PVD chamber. By extending through the wall of side 1110, the targets may be driven by a drive unit.

According to an embodiment, the bearing may not extend through the wall of side 1110, so that the targets are present within the door and thus, within the chamber.

According to some embodiments, door 1100 may have bearings other than the holes shown in FIG. 11*b*. Reference is made to the above explanation to the term "bearing", according to which any type of bearing may be used in a door or a housing of a PVD chamber described herein.

Figure 12:
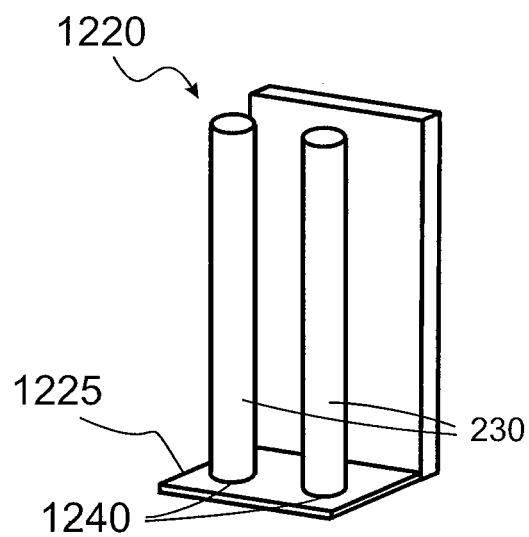

Generally, the door of a PVD chamber as described herein is adapted to the geometrical conditions of the targets 230, the housing 910 and the process parameters. FIG. 12 shows an example of an embodiment of a door, which can be used in PVD chambers as described herein. The embodiment shows that the shape of the door may vary according to different embodiments and is not limited to the shown examples of chambers in the figures.

FIG. 12 shows an embodiment of a door which can be used for a PVD chamber as described herein. The door 1220 may provide a supporting device 1225. The supporting device 1225 for supporting the bearings for the targets can be attached to the door or may be part of the door. FIG. 12 shows an embodiment of the door 1220 in a perspective view. The supporting device 1225 is a plate in the embodiment of FIG. 12. The door 1220 provides bearings 1240 for mounting the targets 230. Optionally, the bearings 1240 may be located on the supporting device 1225. The supporting device may be adapted to carry the weight of the targets 230.

Although many features are described with respect to drawings with concrete reference numbers, it should be understood that the described features are not limited to the embodiments in which the features are shown. For instance, combinations of features shown in different embodiments may also be suitable to allow a chamber to perform the described processes of operating a PVD chamber.

Optionally, the chambers described herein are suitable for a sputtering process. For instance, the chamber may be adapted for film deposition, etching, analysis purposes and the like.

According to some embodiments, the target referred to herein may be a sputter cathode. Optionally, the target being used as a sputter cathode has certain properties with regard to the processes to be performed. For instance, the target may be mounted on a body to ameliorate the ability of the target to provide the function of a sputter cathode. Optionally, the body can be water cooled. According to some embodiments, the sputter cathode can be electrically isolated and connected to a power supply. Optionally, the sputter cathode is able to be set to a negative potential.

Optionally, the chamber may be configured to be used for display applications, such as TFT applications, colour filter applications, touch panel applications or the like, but also for solar applications.

According to some embodiments, the chamber may be configured for large substrate applications. For instance, the chamber can be adapted for enabling a physical vapour deposition over a length of about 1.5 m. According to some embodiments, which can be combined with any other embodiments described herein, the chamber may be adapted for substrates between optionally 0.5 m and 3.5 m, more optionally between 1.0 m and 3.0 m, and even more optionally between 1.5 m and 2.5 m. For example, a substrate may have the size of about 3.0 m×3.5 m. According to some embodiments, the substrate may have a size of a few square centimetres. Optionally, the substrate may be a single-piece substrate or a substrate like a band, which is guided through the chamber by adapted drive units or the like.

According to some embodiments, which can be combined with other embodiments described herein, the bearing of the chamber may be adapted for receiving a sputter cathode for a PVD process. Optionally, the bearing of the chamber may be adapted for holding a sputter cathode for a PVD process. Optionally, the bearing of the chamber may be adapted for fixing a sputter cathode for a PVD process.

Optionally, the chambers described herein may be disposed otherwise than in the vertical position. For instance, the chamber can optionally be arranged in a horizontal arrangement. It should be understood that the indication of the direction is the same for the most parts of the description. FIG. 1 can be a reference for the described direction. For instance, the first direction runs along the longitudinal axis of the target, irrespective of the position the chamber is arranged in.

By using a chamber according to embodiments described herein, the targets or cathodes of a PVD process can be removed quickly from the PVD chamber, resp. from the PVD processing area. According to some embodiments, removal of the targets can be done without disassembling the targets, which spares considerable time and costs. According to embodiments described herein, the targets can be removed by moving them in the first direction of the chamber. The embodiments described herein bring a benefit with regard to the amount of time and costs, as the targets do not have to be disassembled by catching it from the second direction of the chamber.

With the removal of the target from the chamber, resp. the processing area, as described herein, the parts and devices inside the chamber can conveniently be reached and exchanged. Thus, the replacement and cleaning process of parts located within the chamber shortens and the standstill time or idle time of a process chamber diminishes. Greater efficiency and better working capacity result.

The easy and quick access to the chamber, in particular, the inside of the housing and the processing area is common to all embodiments described herein. In other words, by using the chamber according to embodiments described herein, the targets can be reached without the need of accessing the processing area.

While the foregoing is directed to embodiments of the invention, other and further embodiments of the invention may be devised without departing from the basic scope thereof, and the scope thereof is determined by the claims that follow.

The invention claimed is:

1. A chamber for physical vapour deposition comprising:
   a housing;
   a door for opening and closing the housing; and,
   a bearing for receiving and rotating a substantially cylindrical target, the bearing being oriented in a first direction corresponding to the longitudinal axis of the target;
   wherein the chamber comprises a bearing side in which the bearing is located, and an opposite side of the bearing side being opposed to the bearing side in the first direction, and wherein the chamber is adapted so that the target is removable out of the bearing in the first direction if the door is open and at least partially removable from the chamber in the first direction if the door is open;
   wherein the chamber is adapted for receiving the cylindrical target; and
   wherein the bearing is adapted to allow the cylindrical target to be rotated about the longitudinal axis of the cylindrical target.

2. The chamber according to claim 1, wherein the bearing side of the chamber has a greater extension in a second direction substantially perpendicular to the first direction than the opposite side of the bearing side.

3. The chamber according to claim 1, wherein the bearing is located in the door.

4. The chamber according to claim 1, wherein the chamber comprises more than one door.

5. The chamber according to claim 1, wherein the housing comprises at least one target aperture at the opposite side to the bearing side, the target aperture having at least the size of the cross-section of the target.

6. The chamber according to claim 5, wherein the housing and the door have overlapping portions and the door locks up the target apertures of the housing.

7. The chamber according to claim 5, wherein the chamber further comprises at least one locking device for locking up the target aperture.

8. The chamber according to claim 5, wherein the number of target apertures corresponds to the number of bearings.

9. The chamber according to claim 1, wherein the chamber is a chamber for a sputtering process.

10. The chamber according to claim 1, wherein the chamber further comprises a drive unit for driving the target.

11. The chamber according to claim 1, wherein the at least one bearing is adapted for receiving a sputter cathode.

12. The chamber according to claim 1, wherein the chamber is adapted for substrates greater than about 1.5 m.

13. A chamber for physical vapour deposition adapted for receiving a substrate and at least one target having a substantially cylindrical shape and a longitudinal axis, the chamber comprising:
    a housing;
    a door for opening and closing the chamber; and,
    at least one bearing for receiving and rotating the target, wherein the bearing is attached to the door;
    wherein the chamber comprises a bearing side in which the bearing is located, and an opposite side of the bearing side being opposed to the bearing side in the first direction; and
    wherein the bearing to be rotated about the longitudinal axis of the target, and wherein the target is removable from the bearing if the door is open, and the target is at least partially removable from the chamber if the door is open.

14. The chamber according to claim 13, wherein the target is removable from the chamber in a first direction of the chamber, the first direction running from the bearing side of the chamber to the opposite side of the chamber.

15. The chamber according to claim 13, wherein the chamber comprises more than one door.

16. The chamber according to claim 13, wherein the chamber is a chamber for a sputtering process.

17. The chamber according to claim 13, wherein the chamber further comprises a drive unit for driving the target.

18. The chamber according to claim 13, wherein the at least one bearing is adapted for receiving a sputter cathode.

19. The chamber according to claim 13, wherein the chamber is adapted for substrates greater than about 1.5 m.

* * * * *

UNITED STATES PATENT AND TRADEMARK OFFICE
CERTIFICATE OF CORRECTION

PATENT NO.         : 8,758,579 B2
APPLICATION NO.    : 12/781723
DATED              : June 24, 2014
INVENTOR(S)        : Hinterschuster et al.

It is certified that error appears in the above-identified patent and that said Letters Patent is hereby corrected as shown below:

In the Claims:

Column 18, Claim 13, Line 20, please insert --is adapted to allow the target-- after bearing.

Signed and Sealed this
Seventh Day of October, 2014

Michelle K. Lee
*Deputy Director of the United States Patent and Trademark Office*